(12) United States Patent
Lin et al.

(10) Patent No.: US 7,403,418 B2
(45) Date of Patent: Jul. 22, 2008

(54) WORD LINE VOLTAGE BOOSTING CIRCUIT AND A MEMORY ARRAY INCORPORATING SAME

(75) Inventors: Ya-Fen Lin, Santa Clara, CA (US); Elbert Lin, Fremont, CA (US); Hieu Van Tran, San Jose, CA (US); Jack Edward Frayer, Boulder Creek, CA (US); Bomy Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 193 days.

(21) Appl. No.: 11/241,582

(22) Filed: Sep. 30, 2005

(65) Prior Publication Data

US 2007/0076489 A1   Apr. 5, 2007

(51) Int. Cl.
*G11C 11/34* (2006.01)

(52) U.S. Cl. ............................. 365/185.11; 365/185.17; 365/185.18; 365/185.23; 365/185.29; 365/185.33

(58) Field of Classification Search ............ 365/185.11, 365/185.17, 185.23, 185.29, 185.33, 185.18
See application file for complete search history.

(56) References Cited

U.S. PATENT DOCUMENTS

| | | | |
|---|---|---|---|
| 5,029,130 A | | 7/1991 | Yeh |
| 5,572,054 A | | 11/1996 | Wang et al. |
| 5,602,778 A | * | 2/1997 | Futatsuya et al. ...... 365/185.23 |
| 6,157,572 A | * | 12/2000 | Haddad et al. ......... 365/185.23 |

(Continued)

Primary Examiner—Trong Phan
(74) Attorney, Agent, or Firm—DLA Piper US LLP

(57) ABSTRACT

A first embodiment of a word line voltage boosting circuit for use with an array of non-volatile memory cells has a capacitor, having two ends, connected to the word line. One end of the capacitor is electrically connected to the word line. The other end of the capacitor is electrically connected to a first voltage source. The word line is also connected through a switch to a second source voltage source. A sequencing circuit activates the switch such that the word line is connected to the second voltage source, and the other end of the capacitor is not connected to the first voltage source. Then the sequencing circuit causes the switch to disconnect the word line from the second voltage source, and connect the second end of the capacitor to the first voltage source. The alternate switching of the connection boosts the voltage on the word line. In a second embodiment, a first word line is electrically connected to a first switch to a first voltage source. An adjacent word line, capacitively coupled to the first word line, is electrically connected to a second switch to a second voltage source. A sequencing circuit activates the first switch and the second switch such that the first word line is connected to the first voltage source, and the second word line is disconnected from the second voltage source. Then the sequencing circuit causes the first switch to disconnect the first word line from the first voltage source, and causes the second word line to be electrically connected to the second voltage source. The alternate switching of the connection boosts the voltage on the first word line, caused by its capacitive coupling to the second word line. A boosted voltage on the word line may be used to improve cycling and yield, where the memory cells of the array are of the floating gate type and erase through the mechanism of Fowler-Nordheim tunneling from the floating gate to a control gate which is connected to the word line.

14 Claims, 3 Drawing Sheets

U.S. PATENT DOCUMENTS

| | | | |
|---|---|---|---|
| 6,181,606 B1 * | 1/2001 | Choi et al. | 365/185.23 |
| 6,765,832 B1 * | 7/2004 | Ohtani | 365/185.23 |
| 6,865,114 B2 * | 3/2005 | Pio | 365/185.29 |
| 6,967,874 B2 * | 11/2005 | Hosono | 365/185.11 |
| 6,987,694 B2 * | 1/2006 | Lee | 365/185.17 |
| 7,002,844 B2 * | 2/2006 | Park | 365/185.23 |
| 7,020,024 B2 * | 3/2006 | Sim | 365/185.23 |
| 7,031,195 B2 * | 4/2006 | Sato et al. | 365/185.23 |
| 7,167,397 B2 * | 1/2007 | Paillet et al. | 365/185.23 |
| 7,184,305 B2 * | 2/2007 | Tanno | 365/185.23 |

\* cited by examiner

WORD LINE VOLTAGE BOOSTING CIRCUIT AND A MEMORY ARRAY INCORPORATING SAME

TECHNICAL FIELD

The present invention relates to a word line boosting circuit for boosting the voltage supplied on a word line in an array of non-volatile memory cells, wherein voltage may be used by the cell to erase, and more particularly wherein the voltage is boosted through the use of either an additional capacitor, or wherein the voltage is self boosted by the capacitance from an adjacent word line.

BACKGROUND OF THE INVENTION

Non-volatile memory integrated circuit chips are well known in the art. One type of a non-volatile memory cell is of a split gate type, see for example U.S. Pat. Nos. 5,029,130 and 5,572,054, whose disclosures are incorporated herein in their entirety. In these references, each memory cell is a split gate floating gate type cell. A semiconductor substrate is of a first conductivity type. A cell has a first region in the substrate of a second conductivity type. The cell further has a second region in the substrate of the second conductivity type, spaced apart from the first region, to define a channel region therebetween. A floating gate is insulated and spaced apart from a first portion of the channel region and controls the conduction of current through that portion. A control gate is spaced apart from the floating gate and is insulated and spaced apart from a second portion of the channel region and controls the conduction of the current through that portion. The cell is erased by the mechanism of Fowler Nordheim tunneling of charges from the floating gate to the control gate.

The control gates of all the cells lying in the same row are connected together to form a word line. Thus, erasure occurs by applying an erase voltage to one or more word lines erasing all the cells connected to that word line(s).

In the prior art it is also known that such split gate memory cells can be weakly erased, caused by process variation. The weakly erased cells can cause yield loss, data retention, and cycling problems.

In the prior art, one solution to fix the problem of weakly erased cells is to provide for redundant rows or sectors of cells to replace the rows or sectors containing the weakly erased cells. However, redundant rows or sectors is costly in that they occupy precious die area. In addition, they may not be enough if the failure rate of weakly erased cells is high.

In another prior art solution, the weakly erased cells are subject to further repeated erase operation interspersed with a verification (or read) operation to determine if the weakly erased cells have been fully erased. Thus, the operation of erase, verify, erase, verify is repeated. This "solution," however, takes longer time.

Finally, the prior art teaches the mapping out of the weakly erased sectors or rows containing the weakly erased cells, and not using those sectors or rows. This has the disadvantage of reducing the size of the memory that is available for usage.

Accordingly, there is a need to solve the problem of weakly erased cells, without considerable cost, or taking a long time, or reducing the capacity of the memory array.

SUMMARY OF THE INVENTION

Accordingly, in the present invention, two embodiments of a word line voltage boosting circuit and memory arrays incorporating such circuits are disclosed. In the first embodiment an array of non-volatile memory cells comprises a semiconductor substrate of a first conductivity type. The array comprises a first group of non-volatile memory cells. Each memory cell comprises a first region of a second conductivity type in the substrate, and a second region of the second conductivity type in the substrate, spaced apart from the first region, thereby defining a channel region therebetween. A floating gate is insulated from a first portion of the channel region for controlling the conduction of current in the first portion of the channel region. A control gate is adjacent to and spaced apart from the floating gate, and is insulated from a second portion of the channel region for controlling the conduction of current in the second portion of the channel region. A first word line electrically connects all the control gates of all the cells in the same row in the first group. The array further comprises a second group of non-volatile memory cells, each of which is similar to the cells from the first group. A second word line electrically connects all the control gates of all the cells in the same row in the second group. The first word line forms a capacitor with the second word line. A first switch is connected to the first word line and is for electrically connecting the first word line to a first voltage source. A second switch is connected to the second word line for electrically connecting the second word line to a second voltage source. A sequencing circuit activates the first switch connecting the first word line to the first voltage source, while maintaining the second switch in a position to disconnect the second word line from the second voltage source; and activates the second switch connecting the second word line to the second voltage source, while maintaining the first switch in a position to disconnect the first word line from the first voltage source. The alternate switching of the first switch and the second switch boosts the voltage on the first word line.

In a second embodiment, an array of non-volatile memory cells comprises a semiconductor substrate of a first conductivity type. A group of non-volatile memory cells are formed with each cell comprising a first region of a second conductivity type in the substrate. Each cell further comprises a second region of the second conductivity type in the substrate, spaced apart from the first region, thereby defining a channel region therebetween. A floating gate is insulated from a first portion of the channel region for controlling the conduction of current in the first portion of the channel region. A control gate is adjacent to and spaced apart from the floating gate, and is insulated from a second portion of the channel region for controlling the conduction of current in the second portion of the channel region. A word line electrically connects all the control gates of all the cells in the same row in the group. A switch is connected to the word line for electrically connecting the word line to a first voltage source. A capacitor has a first end and a second end, with the first end electrically connected to the word line, and with the second end electrically connected to a second voltage source. A sequencing circuit activates the switch connecting the word line to the first voltage source, while disconnecting the second end of the capacitor from the second voltage source; and connects the second end of the capacitor to the second voltage source, while maintaining the first switch in a position to disconnect the word line from the first voltage source. The alternate switching of the switch boosts the voltage on the word line.

DETAILED DESCRIPTION OF THE INVENTION

Figure 1:
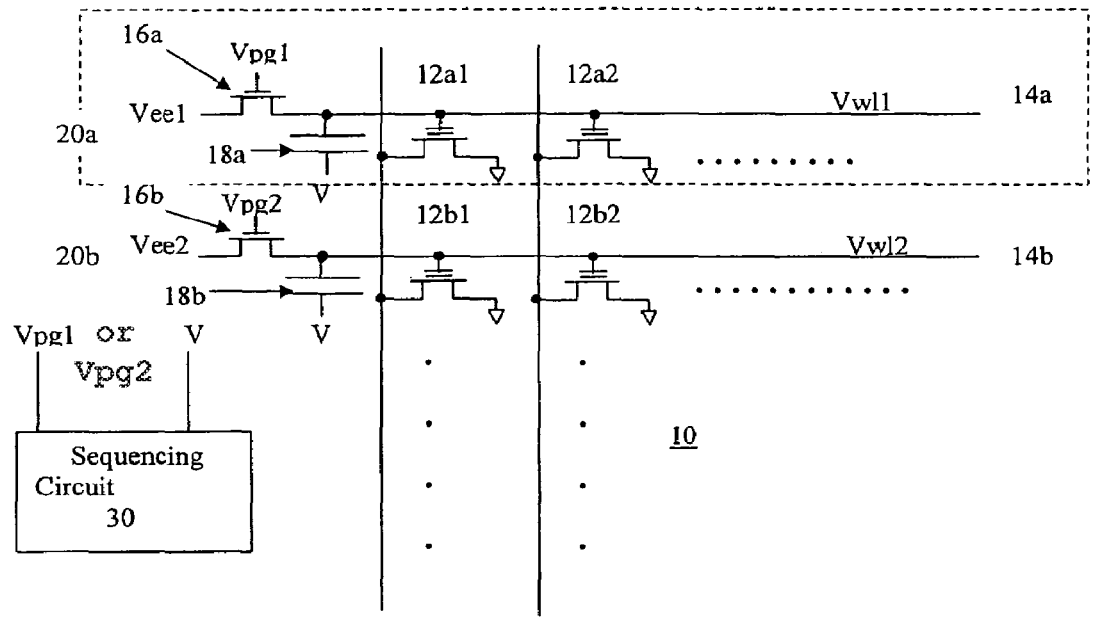
FIG. 1 is a schematic circuit diagram of a first embodiment of a word line voltage boosting circuit of the present invention.
Figure 6:
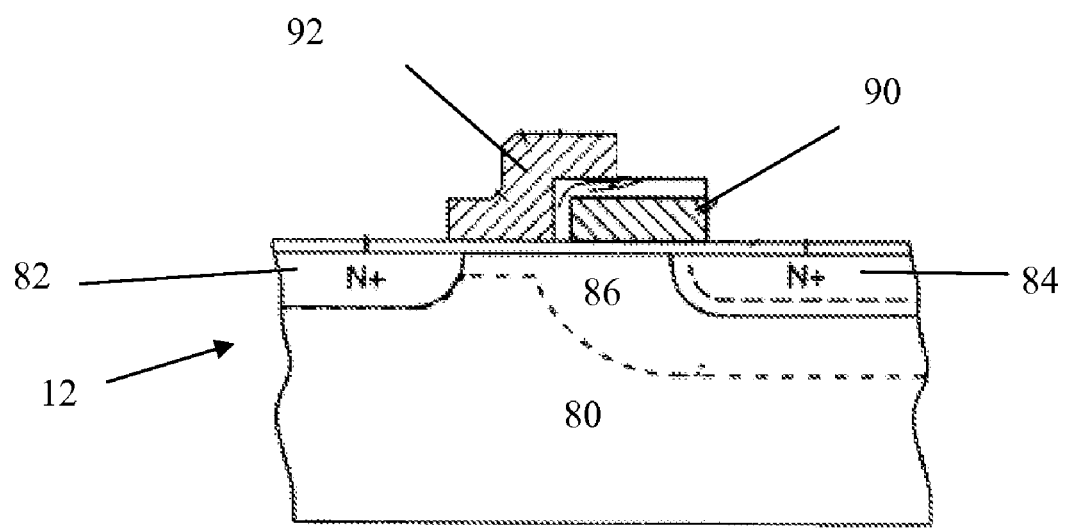
FIG. 6 is a cross-sectional view of a non-volatile memory cell for use in the memory array of the present invention.

Referring to FIG. 1 there is shown a schematic circuit diagram of a first embodiment of a non volatile memory array 10 of the present invention with an improved wood line voltage boosting circuit of the present invention. As discussed in the background of the invention and as discussed in U.S. Pat. Nos. 5,029,130 and 5,572,054, (whose disclosures are incorporated herein in their entirety), the array 10 comprises a plurality of memory cells, such as memory cell 12a1, 12a2, 12b1, and 12b2, arranged in a plurality of rows (e.g. rows 20a and 20b) and columns. Further, as well known in the art, the term "row" and "column" may be inter used interchangeably. In the preferred embodiment, each of the memory cells 12a1, 12a2, 12b1, and 12b2, is of the type disclosed in U.S. Pat. Nos. 5,029,130 and 5,572,054 in which the memory cell is a split gate floating gate type cell. A cross-sectional view of the memory cell 12 is shown in FIG. 6. The semiconductor substrate 80 in which these memory cells 12 are formed is of the first conductivity type. The cell 12 has a first region 82 in the substrate 80 of a second conductivity type. The cell 12 further has a second region 84 in the substrate 80 of the second conductivity type spaced apart from the first region 82 to define a channel region 86 there between. A floating gate 90 is insulated and spaced apart from a first portion of the channel region 86 and controls the conduction of current through that portion. A control gate 92 is spaced apart from the floating gate 90 and is insulated and spaced apart from the second portion of the channel region 86 and controls the conduction of the current through that portion. The cell 12 is erased by the mechanism of Fowler Nordheim tunneling of electrons from the floating gate 90 to the control gate 92. All the control gates 22 lying in the same row e.g. row 20a or row 20b are connected together to form a word line such as word line 14a or Vwl1 or the word line 14b or Vwl2, as the case may be. The array 10 compromises a plurality of rows 20 of memory cells 12.

In the memory array 10 of the present invention, each of the rows 20 (such as row 20a or row 20b) of memory cell is erased by connecting the row line such as Vwl1 or row line Vwl2, to a source of erase voltage Vee1 or Vee2, respectively, each of which is typically a high voltage source. The word line 14a is connected through a switch 16a or transistor 16a to Vee1. The word line 14b is connected through a switch 16b or transistor 16b to Vee2. In the preferred embodiment the transistor 16a or 16b is a P type transistor. Thus, when a low or ground voltage is applied to the gate of the P type transistor (16a or 16b), the transistor 16a or 16b is switched on and the word line 14a or 14b is connected to the erase voltage Vee1 or Vee2, respectively.

Each word line such as 14a or 14b, respectively is also connected to a capacitor such as 18a or 18b respectively. Each capacitor such as 18a or 18b has two ends, a first end connected to the word line 14a or 14b as the case may be and a second end connected to a second voltage source V. Finally, a sequencing circuit 30 is connected to supply the voltage V to the second end of the capacitor 18a or capacitor 18b and to supply a voltage Vpg1 or Vpg2, as the case may be to the gate of the transistor 16a and 16b, respectively.

In the operation of the memory array 10, in the event it is detected that one or more memory cells 12 of the row 20A is weakly erased, and it is desirable to boost the voltage on the word line 14A to attempt to fully erase the one or more weekly erased memory cells 12, the following operation is performed. The sequencing circuit 30 first lowers the voltage VPG1 which is applied to the gate of the switching transistor 16A. This then turns on the transistor 16A causing the erase voltage VEE1 to be supplied to the word line 14A. The sequencing circuit 30 at the same time also connects the second end of the capacitor 18A to ground. Thus, the second voltage V is at ground.

Figure 2:
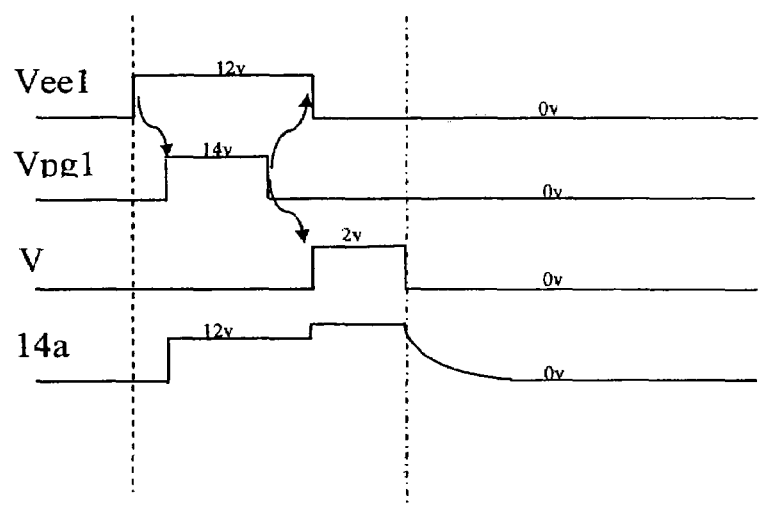
FIG. 2 is a timing diagram of the operation of the circuit shown in FIG. 1.

After the voltage on the word line 14A is brought up to the erased voltage VEE1, the sequencing circuit 30 then disconnects the switching transistor 16A. This can be done by raising VPG1 to a high voltage level, such as VEE1, thereby causing the switching transistor 16A to disconnect the word line 14A from VEE1. At the same time, the sequencing circuit 30 then increases the voltage to the second voltage V so that V becomes a none zero positive voltage. Because the word line 14A is disconnected from the erased voltage source VEE1, it is "floating". When the second voltage V is increased, this boosts the voltage on the word line 14A to a higher voltage by the amount of the second voltage V. A timing chart showing one example of the operation of the circuit is shown in FIG. 2.

Although the embodiment of the memory array 10 shown on FIG. 1 is suitable to boost the voltage on the word line 14, such as word line 14a or 14b, it does require an additional capacitor 18, such as capacitor 18a or capacitor 18b, in each row 20, such as row 20a and row 20b, respectively of memory cells.

Figure 3:
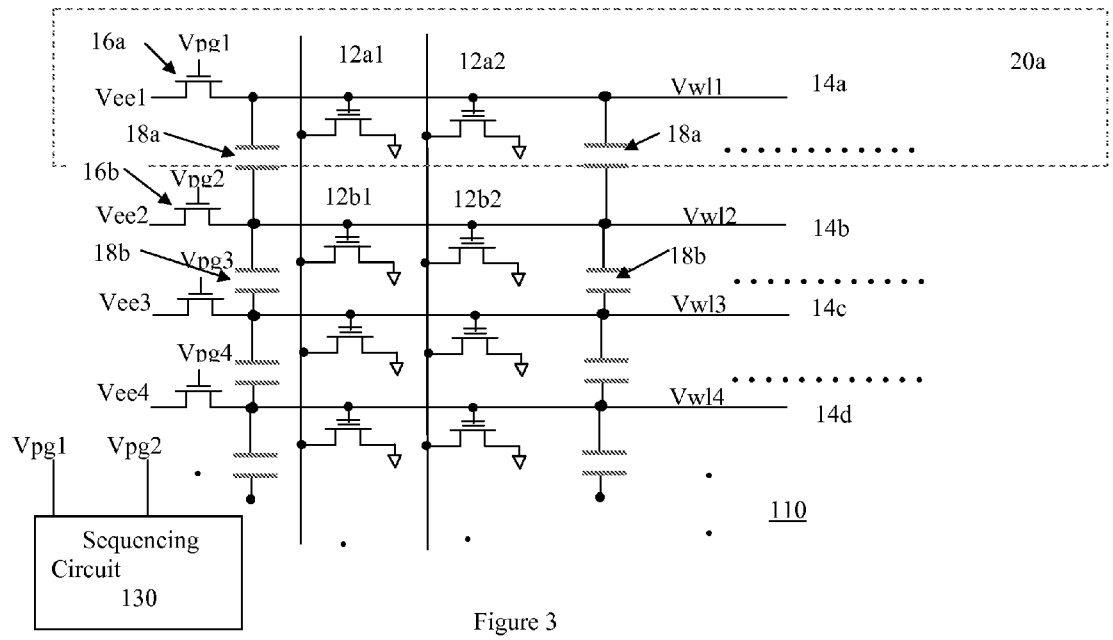
FIG. 3 is a schematic circuit diagram of a second embodiment of a word line voltage boosting circuit of the present invention.

Referring to FIG. 3, there is shown a second embodiment of a memory array 110 of the present invention. The memory array 110 is similar to the memory array 10 in that it has a plurality memory cells 12 (such as memory cells 12a1, 12a2, 12b1, and 12b), arrange in a plurality of rows 20 such as row 20a and a plurality of columns. Each of the memory cells 12 arranged in the same row 20 are connected by a common word line 14, such as word line 14a, 14b, 14c and 14d. The word lines 14a, 14b, 14c and 14d are also designated as Vwl1, Vwl2, Vwl3 and Vwl4, respectively. The word line 14a or Vwl1 is connected to erase voltage Vee1 through a switching transistor 16a. Similarly, the word line 14b or Vwl2 is connected to erase voltage Vee2 through a switching transistor 16b. The word line 14c or Vwl3 is connected to erase voltage Vee3 through a switching transistor 16c, while the word line 14d or Vwl4 is connected to erase voltage Vee4 through a switching transistor 16d. Each of the switching transistors 16a, 16b, 16cand 16d is preferably of P type whose gate is connected to a voltage source, Vpg1, Vpg2, Vpg3 and Vpg4, respectively Thus far, all of the components subscribed hereto for is the same as that described for the corresponding component shown and described in FIG. 1 for the memory array 10.

Each of the rows 20 of memory cell further has a capacitor 18 connected between a row line 14 and its adjacent row line. Thus, a capacitor 18a connects between the row line 14a and row line 14b. The capacitor 18b connects between the row line 14b and the row line 14c. Each of the capacitors 18, such as capacitor 18a or capacitor 18b, however, is not an "actual" capacitor but is a capacitor by virtue of a word line such as word line 14b positioned in proximity to its adjacent word line 14a. In other words, typically, the word lines 14a, 14b, 14c and 14d, etc. are placed parallel to one another and adjacent but spaced apart from one another. As the scale of the integration increases, the spacing or the separation between adjacent word lines 14, such as between adjacent word lines 14a and 14b, decreases thereby increasing the capacitance between the wood line 14a and it is adjacent word line 14b. This forms the capacitor 18. Thus, as shown in FIG. 3, each word line 14 has an associated capacitor 18 which is the capacitance caused by the word line 14 being in proximate location to its adjacent word line.

The memory array 110 further comprises a sequencing circuit 130, similar to the sequencing circuit 30, shown on FIG. 1. The sequencing circuit 130 has two outputs both of which are connected to the gates of the switching transistors 16a and 16b. One output of the sequencing circuit 130 is connected to the gate of the switching transistor 16a while the second output of the sequencing circuit 130 is connected to the gate of the switching transistor 16b which is connected to the word line 14b which is immediately adjacent to the word line 14a.

Figure 4:
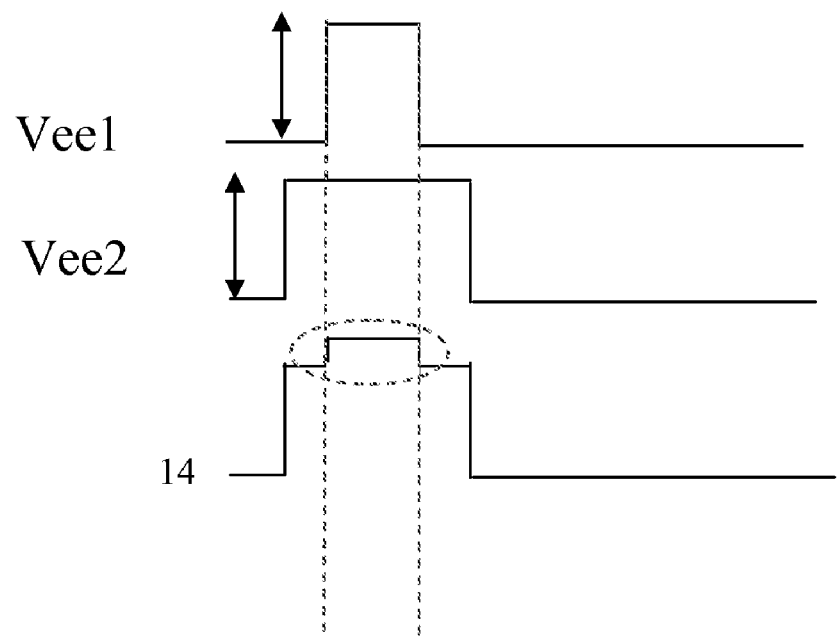
FIG. 4 is a timing diagram showing the operation of the circuit shown in FIG. 3.

In the operation of the memory array 110, with respect to word line 14a, initially, voltage Vpg1 is at low or ground while Vpg2 is high, such as Vee2. This causes the erase voltage Vee1 to be connected to the word line 14a. At the same time with voltage Vpg2 high, the word line 14b is disconnected from the erase voltage Vee2 and is "floating". After the transistor 16a is turned on connecting the word line 14a to the erase voltage Vee1, the word line 14a is raised to the potential of the raise voltage Vee1. The sequencing circuit 130 then proceeds to a second cycle in which the voltage Vpg1 raised to a high level, such as Vee1, while the voltage Vpg2 is lowered to ground or a low level. In this condition, the charged word line 14a is disconnected from the erase voltage Vee1, because the voltage Vpg1 is at a high level. At the same time, with Voltage Vpg2 being low, the word line 14b is then connected to the erase voltage Vee2. When this occurs, the voltage on the word line 14b is raised to the level of Vee2 which through the capacitor 18a boosts the voltage on the word line 14a. Referring to FIG. 4 there is shown a timing diagram of one example of the operation of the array 110.

Figure 5:
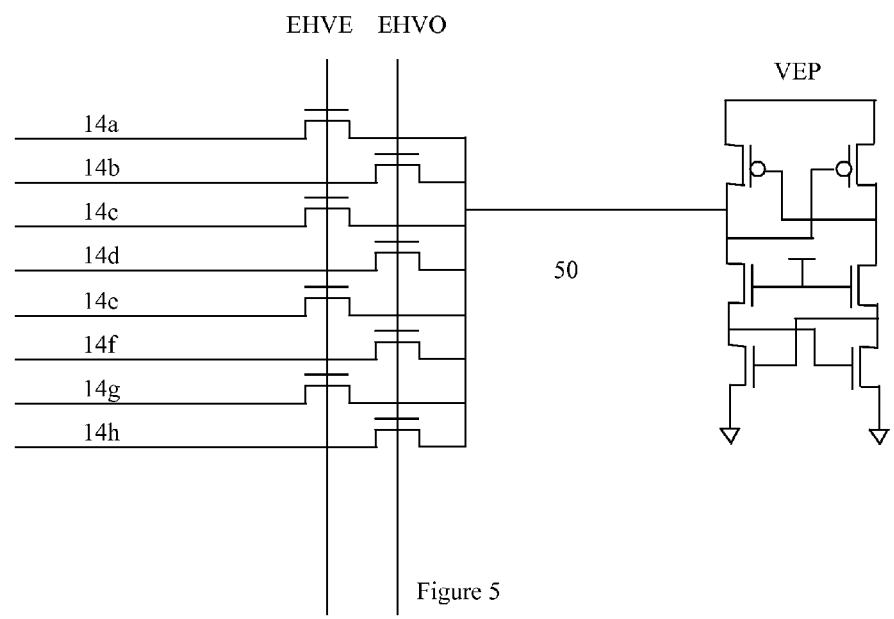
FIG. 5 is a schematic circuit diagram of a decoding circuit for use with the second embodiment of the word line voltage boosting circuit of the present invention.

Referring to FIG. 5, there is shown a circuit diagram of the group of word lines 14a-14h. The alternating word lines, such as 14a, 14c, 14e and 14g are all connected each through a switching transistor activated by the voltage signal EHVE. All the other word lines 14b, 14d, 14f and 14h are connected each through a transistor activated by a common voltage line EHVG. The word lines are all then connected to a source of an erase voltage, VEP. Circuit 50 shown in FIG. 5 shows the grouping of the word lines in which a plurality of word lines are all in one sector and all the memory cells in the same sector are erased alternatingly. In that event, the alternating word lines (even word lines) are connected together and are activated on one cycle by the sequencing circuit 130 and the other alternating word lines (odd word lines) are activated on another cycle. In this manner, the memory cells connected to the even word lines are erased together, initially, and then the memory cells connected to the odd word lines are erased together subsequently, with all the memory cells connected to the even word lines and the odd word lines erased in the same erase cycle for the sector of memory cells connected to both the even and odd word lines. Alternatively, the grouping of the word lines: odd word lines and even word lines may be from different sectors. In that event, the erasure of the memory cells connected to the odd word lines are performed in one erase cycle, while the erasure of the memory cells connected to the even word lines are performed in another erase cycle.

The advantage of the memory array 110 of the present invention is that no extra capacitor 18 is required. The capacitor 18 arises from the word line to word line capacitance which is already in the memory array 110. The only additional circuitry required is the sequencing circuit 130.

As previously discussed, the present invention can be used to boost the erase voltage to the word lines to which weakly erased memory cells are connected. Thus, the voltage boosting or the increase of the erase voltage can occur after erase verification fails or shows that memory cells are weekly erased. Further, the boosting of the erase voltage can occur after cycled erased current, Ir1, fails.

It should be noted that the present invention is superior to the alternatives of adding a cascode to increase the MOSFET gated breakdown voltage, BVdss, of a high voltage PMOS (PH). Further, the present invention is superior to process improvements to increase the BVdss of PH. Finally, the present invention avoids the complication of unnecessary transistors for a local pump for every word line. Finally, the present invention can localize specific word lines after testing to apply a higher erase voltage to target and specifically fix these particular word lines.

Although the present invention has been described with respect to boosting the erased voltage, clearly the present invention can also be used to boost a programming voltage. Further, the voltage on the word line can be positive or negative. Finally, the type of memory cell connected to a word line can be a split gate floating gate cell, as described herein, or a stacked floating gate, or a NVM with trapping layer, or nanocrystal or any other type of memory, volatile or non-volatile, where a higher voltage is required.

What is claimed is:

1. An array of non-volatile memory cells comprising:
   a semiconductor substrate of a first conductivity type;
   a first group of non-volatile memory cells, each cell comprising:
      a first region of a second conductivity type in said substrate;
      a second region of the second conductivity type in said substrate, spaced apart from said first region, thereby defining a channel region therebetween;
      a floating gate insulated from a portion of the channel region for controlling the conduction of current in the portion of the channel region;
      a control gate adjacent to and spaced apart from the floating gate, and capacitively coupled thereto for receiving charges therefrom during an erase operation;
      a first word line electrically connecting all the control gates of all the cells in the same row in the first group;
   a second group of non-volatile memory cells, each cell comprising:
      a first region of a second conductivity type in said substrate;
      a second region of the second conductivity type in said substrate, spaced apart from said first region, thereby defining a channel region therebetween;
      a floating gate insulated from a portion of the channel region for controlling the conduction of current in the portion of the channel region;
      a control gate adjacent to and spaced apart from the floating gate, capacitively coupled thereto for receiving charges therefrom during an erase operation;
      a second word line electrically connecting all the control gates of all the cells in the same row in the second group;
   said first word line forming a capacitor with said second word line;
   a first switch connected to said first word line for electrically connecting said first word line to a first voltage source;
   a second switch connected to said second word line for electrically connecting said second word line to a second voltage source; and
   a sequencing circuit for activating said first switch connecting said first word line, as the selected word line for the erase operation to the memory cells connected thereto, to said first voltage source, while maintaining said second switch in a position to disconnect the second word line from said second voltage source; and for activating said second switch connecting said second word line to said second voltage source, while maintaining said first switch in a position to disconnect the first word line from said first voltage source;

wherein the alternate switching of said first switch and said second switch boosts the voltage on said first word line during the erase operation.

2. The array of claim 1 wherein the voltage from said first voltage source is the same as the voltage from said second voltage source.

3. The array of claim 1 wherein each cell of said first group is erased by an erase voltage applied to the control gate.

4. The array of claim 3 wherein each cell of said second group is erased by an erase voltage applied to the control gate.

5. The array of claim 4 wherein each of said first and second voltage sources generates an erase voltage.

6. The array of claim 5 wherein each of said first and second switches is a PMOS transistor.

7. The array of claim 1 wherein said first group and said second group are in the same sector.

8. The array of claim 7 wherein said first group comprises a plurality of first word lines, wherein said second group comprises a plurality of second word lines, and wherein said first word lines and said second word lines are alternatingly interspersed.

9. The array of claim 1 wherein said first group and second group are in different sectors.

10. An array of non-volatile memory cells comprising:
a semiconductor substrate of a first conductivity type;
a group of non-volatile memory cells, each cell comprising:
   a first region of a second conductivity type in said substrate;
   a second region of the second conductivity type in said substrate, spaced apart from said first region, thereby defining a channel region therebetween;
   a floating gate insulated from a portion of the channel region for controlling the conduction of current in the portion of the channel region;
   a control gate adjacent to and spaced apart from the floating gate, and capacitively coupled thereto for receiving charges therefrom during an erase operation;
   a word line electrically connecting all the control gates of all the cells in the same row in the group;
a switch connected to said word line for electrically connecting said word line to a first voltage source;
a capacitor, having a first end and a second end, wherein said first end is electrically connected to the word line, and wherein said second end is electrically connected to a second voltage source; and
a sequencing circuit for activating said switch connecting said word line, as the selected word line for the erase operation to the memory cells connected thereto, to said first voltage source, while disconnecting the second end of the capacitor from said second voltage source; and for connecting said second end of the capacitor to the second voltage source, while maintaining said first switch in a position to disconnect the word line from said first voltage source;
wherein the alternate switching of said switch boosts the voltage on said word line during the erase operation.

11. The array of claim 10 wherein the voltage from said first voltage source is the same as the voltage from said second voltage source.

12. The array of claim 10 wherein each cell of said group is erased by an erase voltage applied to the control gate.

13. The array of claim 12 wherein each of said first and second voltage sources generates an erase voltage.

14. The array of claim 13 wherein said switch is a PMOS transistor.

* * * * *